United States Patent [19]

Ritter

[11] Patent Number: 4,466,505

[45] Date of Patent: Aug. 21, 1984

[54] SOUND REPRODUCING COMBINATION

[75] Inventor: David Ritter, Aston, Pa.

[73] Assignee: Temporal Dynamics Research, Inc., Aston, Pa.

[21] Appl. No.: 369,825

[22] Filed: Apr. 19, 1982

[51] Int. Cl.[3] .............................................. H05K 5/00

[52] U.S. Cl. ..................................... 181/144; 181/155

[58] Field of Search ............... 181/144, 156, 163, 150, 181/199, 155, 166, 172, 145, 146, 147

[56] References Cited

U.S. PATENT DOCUMENTS

| | | | |
|---|---|---|---|
| 2,713,396 | 7/1955 | Tavares | 181/163 X |
| 3,169,601 | 2/1965 | Smith | 181/156 |
| 3,603,427 | 9/1971 | Sotome | 181/166 |
| 3,903,989 | 9/1975 | Bauer | 181/144 |
| 4,016,953 | 4/1977 | Butler | 181/144 |
| 4,029,170 | 6/1977 | Phillips | 181/155 |
| 4,100,992 | 7/1978 | Rehde et al. | 181/166 |
| 4,196,792 | 4/1980 | Grieves et al. | 181/156 |

*Primary Examiner*—L. T. Hix

*Assistant Examiner*—Brian W. Brown

*Attorney, Agent, or Firm*—Connolly and Hutz

[57] ABSTRACT

High fidelity combination of low-bulk bass signal reproducer with novel upper range reproducer. Bass reproducer is box whose height, width and depth are each between about 15 and about 21 inches, the interior of the box housing a pair of woofer loudspeakers in face-to-face relation, their cones being linked together and the speakers being inter-connected so that they are dynamically driven in oppositely phased relation, the cone frames having side windows that pass sound generated by the cones, the box having on one side an essentially direct mouth permitting the direct radiation of the sound passed by one speaker frame, and the box also having on a different side a baffled outlet for discharging the sound passed by the other speaker frame through a passive resonator that preferentially passes the lowest frequencies. Upper range reproducer has a loudspeaker cone suspended for vibration in a frame mounted in an essentially closed shallow box the face panel of which extends at least about 7 inches out from the cone for at least 270° of the cone periphery, a tweeter is mounted in the baffle adjacent the mid-range loudspeaker, the shallow box enclosing the back waves of the upper range loudspeaker and of the tweeter and being essentially free of vibratory response to sound frequencies higher than about 200 hertz.

11 Claims, 6 Drawing Figures

SOUND REPRODUCING COMBINATION

The present invention relates to sound reproducers, more particularly sound reproducers using loudspeakers or speakers in radio and recorder sound outputs.

Among the objects of the present invention is the provision of novel sound reproducers that are very effective in faithfully reproducing the desired sounds.

Additional objects of the present invention include high quality sound reproducer constructions that are relatively small in size.

The foregoing as well as still further objects of the present invention will be more fully demonstrated in the following description of several of its exemplifications, reference being made to the accompanying drawings wherein.

Figure 1:
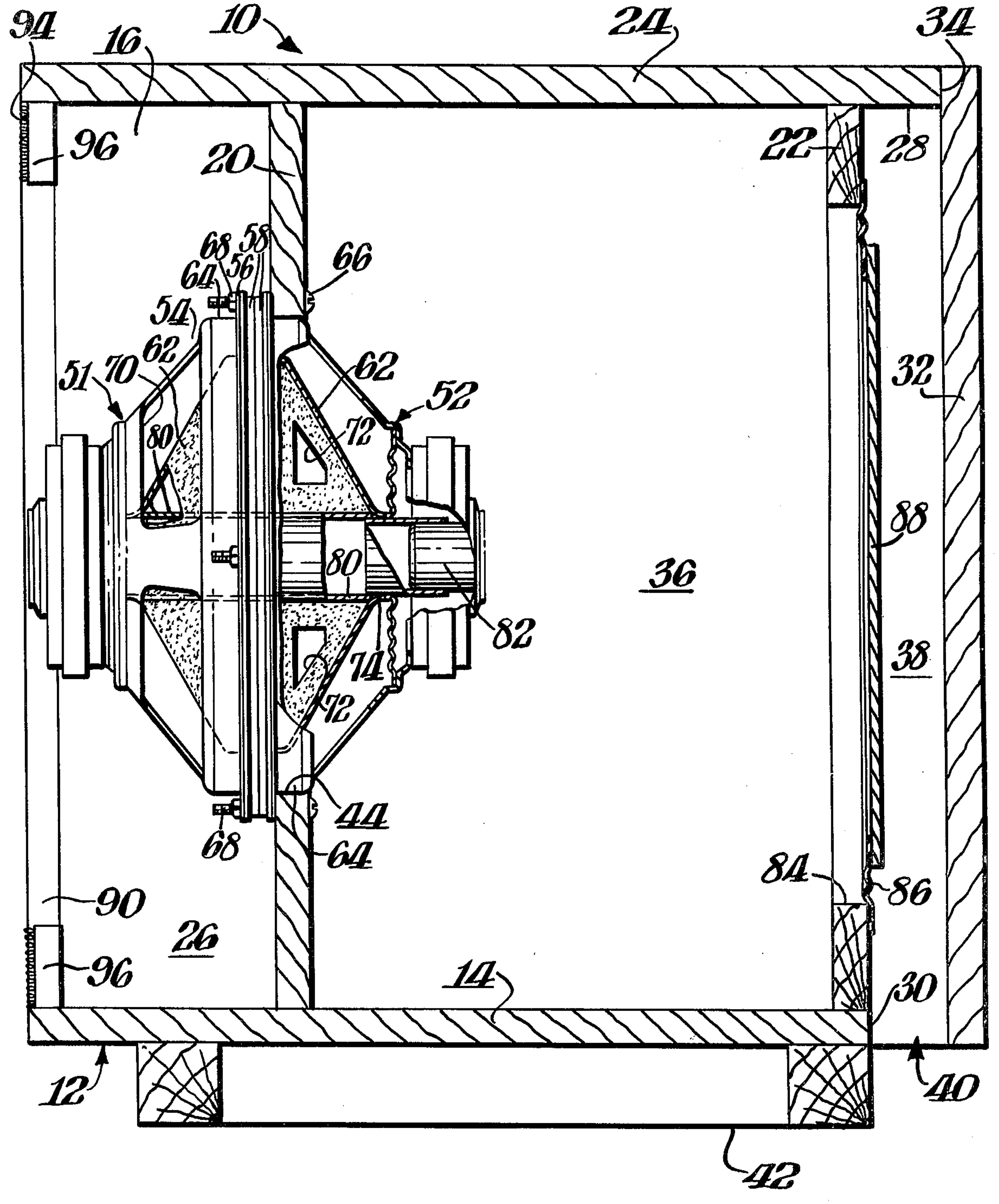
FIG. 1 is a vertical sectional view, with parts broken away, of a woofer type sound reproducer according to the present invention.

The sound reproducer combination of the present invention is of the so-called high fidelity type intended to faithfully reproduce sounds in the usual type of living room of a home. Such a room is generally at least about 12 feet by 18 feet in floor size and about 8 feet high, and the floor is frequently covered by a rug. The sounds to be reproduced are generally those from the electrical output of a radio, record player or tape recorder or the like, and have a range of frequencies from as low as about 20 hertz to as high as about 16 kilohertz.

Faithful response of a speaker calls for reproduction of all audible frequencies at the correct amplitude, as well as accurate reproduction of rise and decay times for all such signals, and spacial distribution of the reproduced sound in a manner closely corresponding to that of the original sounds.

Loudspeakers or speakers have long been used as sound reproducers, different kinds being adapted to reproduce the different frequencies. While the art has developed relatively inexpensive amplifiers that do a very good job of providing the electrical signals for high quality sound, the necessary speaker systems have generally been quite expensive as well as bulky. This is particularly true of stereo systems, where two separate sound reproducing systems are used to separately reproduce a pair of stereo sounds. Even these expensive and bulky systems generally fail to faithfully reproduce sound in the comprehensive sense discussed above.

The bulkiest portion of such systems is the woofer, which is supposed to reproduce sounds having frequencies below about 200 to 300 hertz. According to the present invention a woofer sound generating apparatus has a box whose height, width and depth are each between about 15 and about 21 inches, the interior of the box housing a pair of woofer loudspeakers corresponding to each other in size, each having a dynamically driven speaker cone held by the face of a supporting frame, the frame faces being clamped to each other in face-to-face relation, the cones being linked together and the speakers being interconnected so that they are dynamically driven in oppositely phased relation, the cone frames having side windows that pass sound generated by the cones, the box having on one side an essentially direct mouth permitting the direct radiation of the sound passed by one speaker frame, and the box also having on a different side a baffled outlet for discharging the sound passed by the other speaker frame through a passive resonator that preferentially passes the lowest frequencies. The box preferably contains a partition that effectively separates the sounds passed by the respective speaker frames. To provide the best transmission for the very lowest frequencies, the diaphragm should be at least as wide as the wider speaker frame, and be weighted to furnish optimized control for the interaction between the speakers and the air confined within the box.

To reduce the bulk of the sound reproducer for higher frequencies and improve their spacial distribution, a separate mid-range loudspeaker has a cone suspended for vibration in a frame about 4½ inches in diameter and about 2 inches deep, the frame is mounted in an essentially closed box not more than about 2 inches deep, the face panel of which extends at least about 7 inches out from the cone for at least 270° of the cone periphery, the frame mounting being about one to about 3 inches away from the center of that face panel, a tweeter is mounted in the baffle adjacent the mid-range loudspeaker, the box enclosing the back waves of the loudspeaker and of the tweeter and being essentially free of vibratory response to sound frequencies higher than about 200 hertz. The small size of these drivers relative to the wavelengths to be reproduced results in much improved spatial response.

Figure 2:
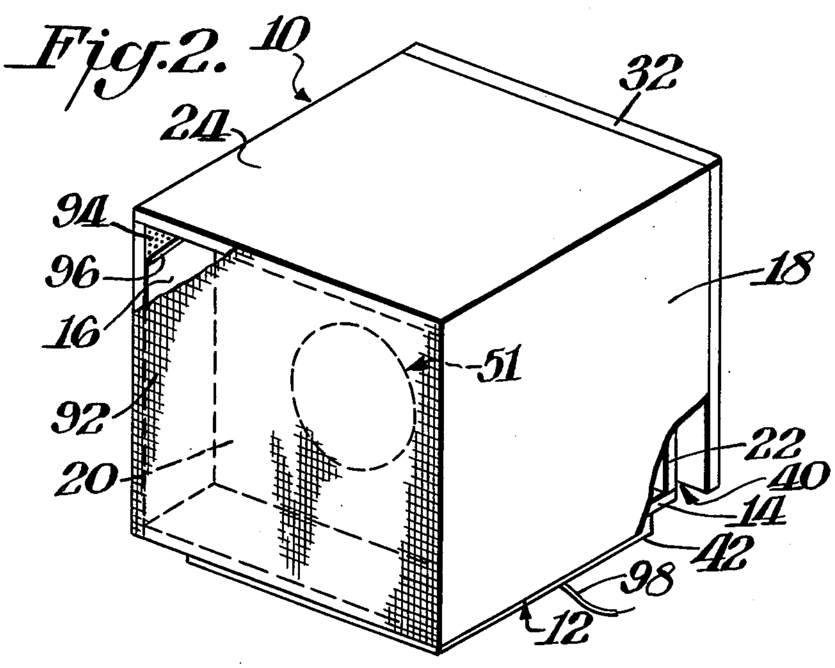
FIG. 2 is an isometric view, with parts broken away, of the sound reproducer of FIG. 1 as it is arranged for operation.

Turning now to the drawings, FIGS. 1 and 2 show a sound reproducer 10 for woofer frequencies. This reproducer consists of a box 12 having a floor panel 14 and four upright walls 16, 18, 20 and 22 on which walls a top panel 24 is secured. Walls 16 and 18 connect opposite edges of the floor and top panels, but wall 20 is recessed in the box to provide an open outer chamber 26.

Top panel 24 is in one direction a litter larger than floor panel 14, and thus provides a short overhang 28. Wall 22 is secured in upright position with respect to the corresponding edge 30 of the floor panel, and an extra outer wall 32 is mounted in spaced relation to wall 22 by being secured to the edge 34 of overhang 28 as well as to side walls 16, 18.

The foregoing combination provides an enclosed central chamber 36, and a separate open-bottomed sound-directing chamber 38 with a sound-discharging mouth 40 at its bottom. Box 10 is supported by a short hollow pedestal frame 42 secured to the lower face of floor panel 14 and recessed from all its side faces.

Wall 20 has a large circular cut-out 44 into which is fitted a mated pair of loudspeakers 51, 52. Each of these speakers has a mounting frame 54 with an out-turned flange 56 to which is cemented the usual annular mounting pad 58 and resilient ring that resiliently holds the outer edge of a speaker cone 62. Flange 56 merges into a generally cylindrical section 64 of the frame, and this section 64 of speaker 52 is shown as fitted into cut-out 44. A set of bolts 66 penetrate the thickness of wall 20 as well as aligned mounting holes in flanges 56 to secure the speakers in place face-to-face, with the help of nuts 68.

Speaker frames 54 are preferably of metal and have large windows 70 to expose the outside of their cones to the ambient air. In addition cone 62 of speaker 52 has a number of spaced openings 72 punched out of its side. These openings can have a circular, rectangular, oval, or any other general outline and can be from about ½ inch to about 1½ inches in width. Also the small ends 74 of both cones are linked together by a light-weight tube 80 of paper for example, extending between and cemented to those ends. The ends of tube 80 can be just large enough in diameter to fit snugly around or inside the end of the voice coil form 82 to which the cone is secured.

Wall 22 has a cut-out opening 84 even larger than opening 44. Across this opening is cemented a resilient supporting ring 86 that holds a diaphragm panel 88 so that it vibrates when very low frequency sounds impinge on it. The diaphragm panel 88 is preferably of such mass as to significantly reduce the travel of the speaker cones at the lowest frequencies. A disc of pressed wood weighing at least about ⅛ gram per square centimeter of area that it spans, is a very effective diaphragm when resiliently mounted at its edges.

The open face 90 of chamber 26 can be covered by speaker grill cloth 92 which can be secured in lace by its edges. If desired face 90 may remain uncovered in use. Velcro-type fastener strips 94 can be cemented to the corners of the mouth, preferably over wedges 96 cemented just inside those corners, and mating strips sewed to the inner face of the grill cloth at its corners. If desired two-faced pressure-sensitive tape can be used instead of the velcro-type fasteners.

Mouth 40 faces downwardly and is close to the surface on which box 10 is placed, so that this mouth needs no cover. Grill cloth 92 need not be very strong, inasmuch as it does not serve as significant protection for the delicate speaker cones.

Such a speaker combination reduces the volume equivalent compliance of the combination so that enclosed chamber 36 may be optimally reduced to half the otherwise required volume. Also, in a stero system the bass frequenceis may be added together mechanically by application of right and left low frequency signals to the terminals of speakers 51 and 52 respectively with the phasing connection to 51 reversed relative to 52. This maintains complete electrical isolation between channels. The push-pull symmetric nature of the combination significantly reduces asymmetric cone motion and therefore reduces asymmetric distortion in a manner similar to the reduction achieved by push-pull type electronic amplifiers.

With cones so coupled such that no motion of a single cone relative to the other is possible, and with one cone vented to the chamber in the box, the possiblity of resonances in the frequency range from 200 to 1000 hertz is eliminated. Prior art configurations with face-to-face drivers and a sealed inner air volume between cones as the coupling medium, as in U.S. Pat. No. 4,016,953, present resonance problems in this range.

The cones need not be identical to each other and need not be driven by identical drivers, but identical speaker constructions are less expensive to manufacture.

A very effective woofer unit 10 has its height, width and depth, without pedestal 42, each about 18¾ inches measured on its exterior surfaces, with speakers 51, 52 identical to each other, both having 10 inch frames, a total Q ($Q_T$) of about 0.4 and a resonant frequency below 30 hertz. The walls of the box structure should be rigid enough so that they are not vibrated by the sounds generated at the speakers, and preferably made of particle board at least about ⅝ inch thick.

Co-acting with the foregoing speakers, vibratory diaphragm panel 88 is preferably a disc about 11 inches in diameter, and chamber 38 about 1½ inches thick. A pedestal 42 also about 1½ inches thick is enough for use on floors covered with deep-pile rugs.

The top as well as sides of box 10 can be covered, as with cushiony material, and whether or not so covered is strong enough to serve as a rugged table top, and can be sat on or stood on by even heavy people without damage. The completely equipped box can weigh as much as 40 or more pounds. A lead such as twin speaker wires 98 can enter chamber 26 via a hole drilled in floor 14. Where crossover or compensation circuits are used, their components can be mounted on the floor of chamber 26, and an additional hole through wall 20 permits running leads to the inner speaker 52.

Figure 3:
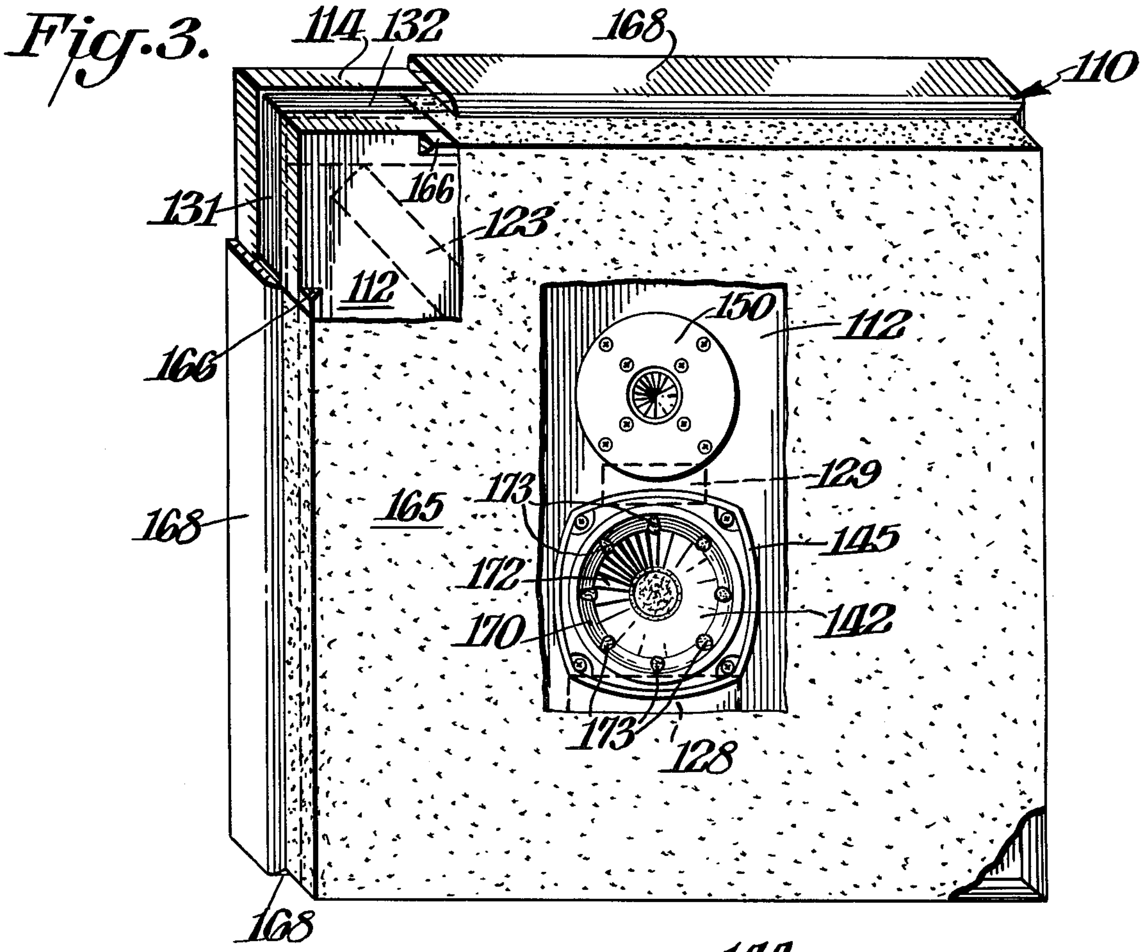
FIG. 3 is an isometric view of a sound reproducer of the present invention used to reproduce sounds having frequencies higher than that of a woofer, parts being broken away for clarity.
Figure 4:
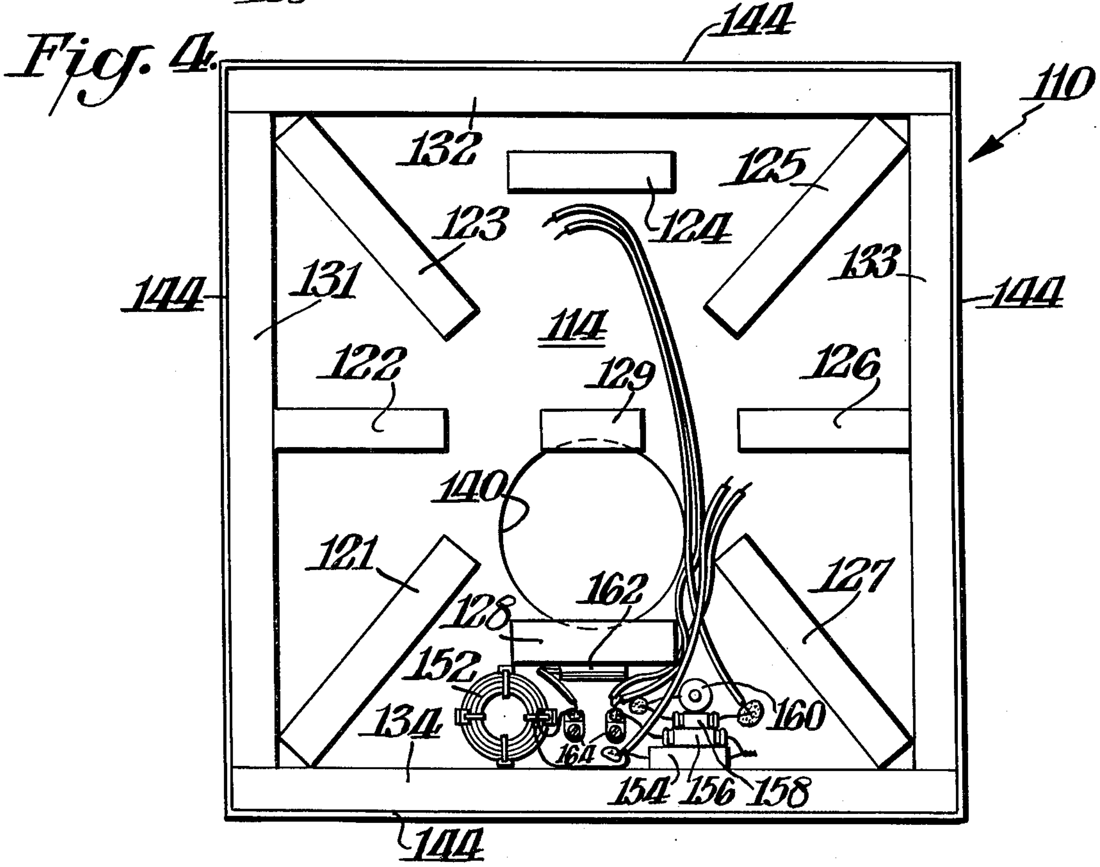
FIG. 4 is a plan view of the loudspeaker of FIG. 3 with its face board removed.

FIGS. 3 and 4 illustrate a sound reproducing combination in the general form of a shallow box 110. The box has a facing panel 112, a rear panel 114, and a set of inner spacers 121, 122, 123, 124, 125, 126, 127, 128 and 129, and outer spacers 131, 132, 133 and 134 sandwiched between the panels. A pocket 140 is routed out of the inner surface of the rear panel to receive the rear portion of a mid-range speaker 142. As shown by the narrow peripheral margin 144, the outer spacers 131, 132, 133 and 134 have their outer edges recessed inwardly from the outer edges of the rear panel.

Speaker 142 is mounted inside an opening in the face panel 112, and has a frame with a peripheral flange 145 that is screwed or bolted to the outer face of that panel. The overall depth of the speaker is about two inches so that the panels and the spacers can each conveniently be from about ⅝ to about ¾ inch thick pieces of particle board to provide a speaker-accommodating pocket 140 that does not penetrate completely through the rear panel.

A tweeter speaker 150 is mounted in another opening in face panel 112 near mid-range speaker 142. Inasmuch as tweeter speakers are quite shallow in overall depth, no pocket is needed in rear panel 114 to accommodate speaker 150. The hollow interior of box 110 provides between the spacers, ample room for locating crossover and/or compensation circuits, such as is shown in FIG. 4 by the circuit components 152, 154, 156, 158, 160 and 162. There are appropriately wired together, to the leads of the speakers, and to incoming terminals 164 that are bolted through the rear panel. The components can also be fixed in position as by cementing or clamping them in place.

Before completing the assembly of the structures, a caulking or similarly soft filler material is placed in pocket 140, so that the rear of speaker 142 presses against such soft filler and thus supports and strengthens the relatively thin wall at the bottom of the pocket, and keeps it from vibrating in resonance to the sounds generated by the speakers. The remainder of the panels, and the spacers, are too thick for such vibration, and need no further attention in this respect.

The combination of FIGS. 3 and 4 does an extremely good job of reproducing sound frequencies above about 200 Hertz, with a mid-range speaker having a frame no larger than 4½ inches, a cone that resonates at about 70 Hertz, and a $Q_T$ of from about 0.5 to about 1, where the face of the box extends laterally at least about seven inches from the cone of speaker 142, for about three-fourths of the cone perimeter. For the remaining one-fourth of the cone periphery, that face extends out at least 4 inches from the cone. This is accomplished by dimensioning the face panel so that it is about 18 inches by 18 inches or slightly smaller, and having speaker 142 offset about two inches from the center of that panel.

A mounting loop can be fixed to the rear surface of rear panel 114, so that the box can be readily hung on a wall that is provided with a conventional picture hook. Hanging the box in this way so that its tweeter is about four to five feet up from the floor, is preferred. The box is so thin and blocks all sound directed backwardly from its speakers, so that when so hung the sound propagated forwardly behaves very much like that from a speaker in a planar baffle of infinite size.

The front face of box 110 is shown in FIG. 3 as planar, but if desired that face can be made frusto conical with speaker 142 at the frustrum. The thickness of the box can then taper down from a maximum of about two inches at speaker 142 to a thickness of as little as a half inch or so at the box periphery. Such a tapered construction may be more conveniently made in the form of a disc, as in FIG. 3I of U.S. Pat. No. 3,964,571 so that the box has a generally circular outline. Box 110 can also be made with a circular outline and without the tapered thickness.

In FIG. 3, box 110 is shown as having its face covered with grill cloth 165 that is stretched over a marginal stand-off frame of quarter-round rods 166. The margins of the grill cloth are secured as by stapling to the exposed faces of outer spacers 131, 132, 133 and 134, and the secured edges covered by trim strips 168 that span across the outer edges of the rear panel as well as of the foregoing spacers. Using a grill cloth that has a stretch weave enables it to be more readily and neatly stretched over and around corners.

For best results with the mid-range speaker, it is treated to spot stiffen the resilient ring 170 that resiliently holds the outer margin of its cone 172. During operation there is a tendency for local resonances to cause ringing instead of abrupt sound decay, and thus distort the generated sound. Applying adhesive dabs 173 about ¼ inch in diameter about 1 inch apart on the resilient ring 170 where it is cemented to the cone, significantly reduces this type of distortion. Any adhesive can be used, even those like rubber cement that leave a resilient deposit. A heavy deposit of resilient rubber on a spot of the ring very effectively reduces the resiliency of that spot as compared to the remainder of the resilient ring. The dabs can vary in width from about ⅛ to about ⅜ inch, and can if desired be placed as much as two inches apart although such spacing might not always provide the desired damping. In general the best results are obtained where the cone of speaker 142 is made of paper and the resilient surround is cloth rather than foam.

Figure 5:
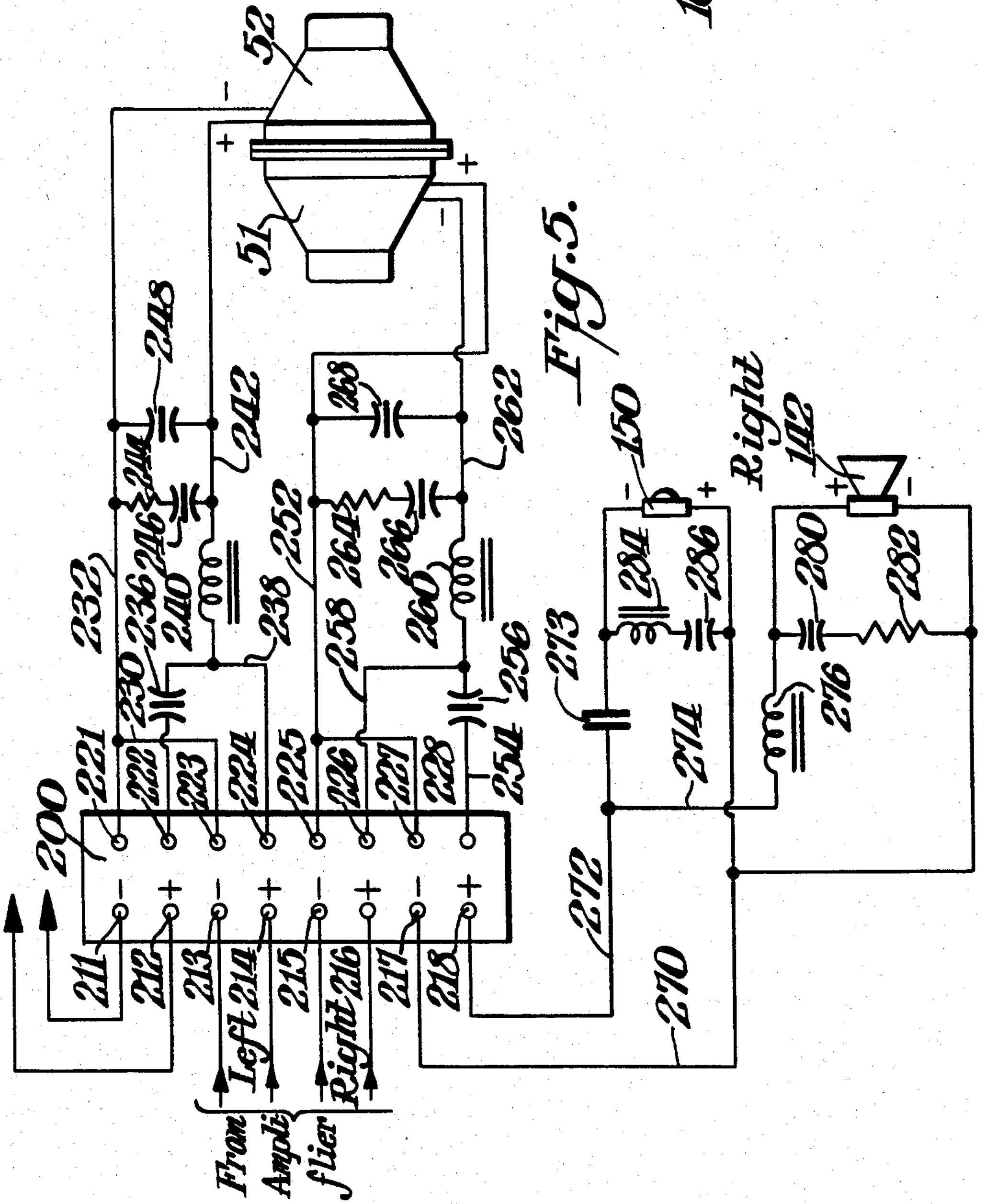
FIG. 5 is a schematic diagram of a circuit of the present invention for supplying to the sound reproducers of FIGS. 1 and 3 the electric signals to be reproduced.

The circuit diagram of FIG. 5 illustrates a very desirable cross-over and compensation network that coacts with the various speakers of FIGS. 1 and 3 to produce excellent sound reproduction from electrical signals delivered by an amplifier having a stereo output each channel of which has an eight ohm output impedance.

A terminal board 200 which can be mounted in the woofer box 10, has a series of eight external connector terminals 211, 212, 213, 214, 215, 216, 217 and 218, and a companion series of eight internal connector terminals 221, 222, 223, 224, 225, 226, 227 and 228, each of which is conductively linked to its companion terminal. Leads from the left stereo channel are connected to terminals 213, and 214, which leads from the right stereo channel are connected to terminals 215 and 216. The phasing of the leads is shown by the plus and minus marks.

Conductor 230 connects terminals 223 to conductor 232 which runs from terminal 221 to the minus terminal of speaker 52. Conductor 234 connects one terminal of bipolar electrolytic cross-over capacitor 236 to board terminal 222, while conductor 238 connects the other terminal of capacitor 236 to board terminal 224. Also connected to conductor 238 is one terminal of cross-over inductor 240, the other terminal of which ties through conductor 242 to the plus terminal of speaker 52. A very effective crossover frequency of about 200 Hertz is provided by a capacitor 236 of 100 microfarads, and an inductor 240 of 6.8 millihenrys having a maximum of about 0.5 ohm resistance, where speaker 52 has a voice coil of 7 to 8 ohm impedance. As a matter of precaution capacitor 236 can have a 100 volt operating potential, in which case it is preferably a non-polarized electrolytic capacitor or a parallel pair of 50-microfarad 100-volt non-polarized electrolytics.

Between conductors 232 and 242, there is connected a compensation network consisting of a series-connected resistor 244 and capacitor 246, along with a bridging capacitor 248. With a speaker 52 having the foregoing impedance, a very effective value for resistor 244 is 7.5 ohms, while capacitor 246 is 50 microfarads and capacitor 248 33 microfarads. These two capacitors need not be rated for operation at voltages greater than about 50 volts.

The combination of resistor 244 and capacitor 246 provides a high pass electrical impedance whose time constant is computed to match the time constant of the electrically inductive and resistive components of the voice coil in speaker 52. This provides a desirable constant load for crossover elements consisting of capacitor 236 and inductor 240 and greatly enhances their operation.

Where speaker 51 has about the same voice coil impedance as speaker 52, its crossover and compensation network components 256, 260, 264, 266 and 268 and wiring 252, 254, 258 and 262 can be exactly the same as the corresponding parts for speaker 52. However the conductors 252, 262 are connected in opposite phase with respect to the terminals of speaker 51.

FIG. 5 also shows a very desirable crossover and compensation network for a set of speakers 142, 150 that reproduce the higher frequency sounds in one of the stereo channels. The other stereo channel can be identically treated. For the illustrated network, conductor 270 ties minus terminal 217 directly to the minus terminal of speaker 142 as well as to the plus terminal of speaker 150. Conductor 272 leads from plus terminal 218 through conductor 274 and inductor 276 to the plus terminal of speaker 142. Conductor 272 also connects through capacitor 278 to the minus terminal of speaker 150. Across the terminals of speaker 142 is bridged a series-connected capacitor 280 and resistor 282, while bridged across the terminals of speaker 150 is a series-connected inductor 284 and capacitor 286. Series connected capacitor 280 and resistor 282 perform the same compensation function for mid-range speaker 142 as resistor 244 and capacitor 246 provide for woofer speaker 52. Series connected inductor 284 and capacitor 286 compensate for the fundamental resonance of speaker 150. Compensation of a tweeter with such a series connected bridge has been found to give particularly good square wave response in a microphone, as well as improved sound reproduction.

With the voice coil of speaker 142 of about 7.5 ohms impedance, and that of speaker 150 of about 6.8 ohms impedance, a four-microfarad capacitor 278 and a 0.37 millihenry inductor 276 wound from 18 gauge copper wire provide a desirable crossover at about 4500 hertz. As diagrammatically indicated, capacitor 278 need not be a non-polarized electrolytic; is is preferably a polyester film capacitor. The compensation network for speaker 142 desirably has its capacitor 280 of 10 microfarads rated for 50 volt operation and its resistor 282 a 7.5 ohm 10 watt resistor. Speaker 150 has its leads inverted and in addition its compensating network includes a capacitor 286, preferably a 20 microfarad 50 volt capacitor, in series with inductor 284 preferably a 1.8 millihenry 5.6 ohm inductor. This compensation is particularly suitable where the tweeter is mechanically resonant at about 900 hertz, and has a soft dome construction, a 9-ounce magnet, and an aluminum coil bobbin. Capacitor 286 and inductor 284 should resonate at the mechanical resonance frequency or within or about plus or minus 10% of that frequency, and the resistance of the compensation circuit can if desired be further selected to provide minimum ringing. Such selection is best made by trial and error measurements, using different capacitance and inductance values that maintain the foregoing electrical resonance.

The quality of the sound reproduction of the present invention is even further improved when instead of having one FIG. 3 box per stereo channel with that box mounted on the wall of a room, two such boxes are mounted back-to-back spaced from a wall. Thus a simple stand can be provided with a thin upright holding hooks at the desired height on its opposite faces, and separate boxes mounted on the respective hooks. Both such boxes should then have the voice coils of their corresponding speakers connected to receive the electrical signals for the same stereo channel, but the crossover network 256, 260 having its values modified to allow for the extra speakers. Where the speakers added for the doubling are identical with the single set of speakers, it is enough to merely double the capacitance of crossover capacitor 256. Crossover networks can also be built into the outputs of amplifiers, if desired.

Alternatively when doubled boxes are used, their speakers can have voice coils with twice the impedance of that for a box when used alone. No changes are then needed in the crossover network.

The foregoing box doubling can be effected with either channel alone, or with both channels, and the doubled boxes for any channel can have their outputs in phase. A set of such doubled boxes can also be mounted on the top panel 24 of the woofer box 10, or the individual boxes of the pair mounted on adjacent side panels of the woofer box.

Figure 6:
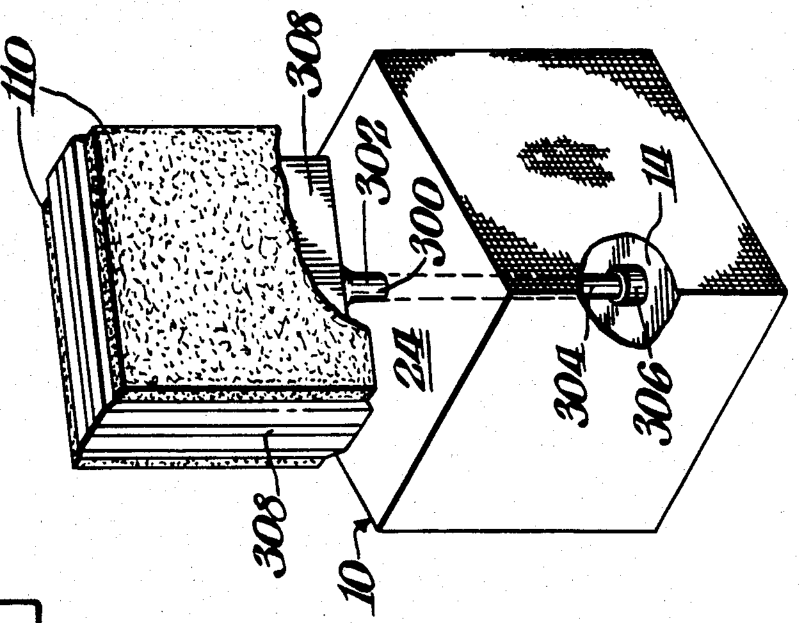
FIG. 6 is an isometric view of a particularly desirable combination of the sound reproducers of FIGS. 1 and 3.

FIG. 6 diagrammatically illustrates a very desirable speaker combination according to the present invention. Here a bass box 10 has an opening 300 in its upper panel 24, and a paddle-shaped upright 302 is fitted into that opening. The lower portion of upright 302 is rod-shaped as at 304 and is seated in a socket 306 secured to floor panel 14. The upper portion of the upright is shaped like a board 308 having the height and width of a speaker box 110. Two such boxes are hung, one each on the respective faces of board 308, as by recessed hooks. Opening 300 can be made so tight fitting with respect to rod 304 as to keep the upright from rotating in its socket unless forcefully moved.

Placing box 10 so that its mouth 90 faces a wall of a room and is at least about 6 inches, preferably 8 to 12 inches, from that wall, then permits adjustment of the upright so that its upper portion does not obstruct any desired view or interface with movement around it. Another pair of back-to-back boxes 110 can then be provided on a different support to complete the stereo sound reproduction. A second bass box 10 is not needed inasmuch as no significant stereo perception is obtained from the bass sounds. Thus arranged, performance even better than that of the wall mounted unit is achieved. The output of the rear speaker of such a back-to-back pair behaves like a reflection from the front speaker when the front speaker is hung on a wall and so provides a response similar to that of the wall-mounted unit, but the back-to-back pair yields significantly greater reverberant sound adding a desirable increase in perceived depth and imaging.

Where a bass box 10 is in contact with upper range box 110, the running of the wires to the boxes is somewhat simplified. Thus in FIG. 6 the leads to boxes 110 can run down a groove in the face of the upright rod 304, or can run through a passageway drilled through that rod, and thus be directly connected to a supply network that can be mounted in box 10.

Obviously many modifications and variations of the present invention are possible in the light of the above teachings. It is therefore to be understood that within the scope of the appended claims the invention may be practiced otherwise than as specifically described.

What is claimed:

1. A woofer sound generating apparatus for delivering sounds having frequencies down to below 30 hertz, said apparatus having a box whose height, width and depth are each between about 15 and 21 inches, the interior of the box housing a pair of woofer loudspeakers corresponding to each other in size, each having a dynamically driven speaker cone held by the face of a supporting frame, the frame faces being clamped to each other in face-to-face relation, the cones being mechanically linked together and the speakers being interconnected so that they are dynamically driven in oppositely phased relation, the cone frames having side windows that pass sound generated by the cones, the speaker frames being mounted so that the cone of one frame radiates sound directly out one side of the box, and the box also having on a different side a baffled outlet containing a passive resonator that preferentially passes the lowest frequencies to an outer vertically directed duct open at its bottom to discharge said lowest frequencies downwardly.

2. The combination of claim 1 in which the box contains a partition that effectively separates the sounds passed by the respective speaker frames.

3. A woofer for receiving electrical signals and converting them to sounds, said woofer having a closed chamber with a volume of from about 2400 to about 5000 cubic inches, one wall of the chamber having an aperture which is filled by a sound generator having electrically driven cone elements that generate sounds which have a frequency not over about 200 hertz, a different wall of the chamber having an opening covered by a passive resonator panel at least as wide as the opening for the sound generator, the chamber volume being matched to the effective volume compliance of the cone elements for accentuating the lowest sound frequencies generated by the speakers, the resonator panel being weighted to preferentially respond to those lowest sound frequencies and trasmit those lowest frequencies to a baffled sound outlet duct open at its bottom to discharge the lowest frequencies downwardly.

4. The combination of claim 2 in which the sound generator has two woofer speaker cones mounted face-to-face, the small ends of the cones being mechanically connected to each other to cause both cones to vibrate as a unit.

5. The combination of claim 4 in which each speaker cone is held in a 10-inch frame and the sound generator has a low sonic resonance below about 30 hertz.

6. A woofer sound generating apparatus having an enclosure containing a pair of woofer loudspeakers corresponding to each other in size, each with a dynamically driven speaker cone held by the face of a supporting frame, the frame faces being clamped to each other in face-to-face relation, the cones being mechanically linked together so that they vibrate as a unit, the speakers being interconnected so that they are dynamically driven in oppositely phased relation, the cone frames having side windows that pass sound generated by the cones, and one of the cones having a number of cut-outs that open into the interior of the enclosure and establish communication between the air in the enclosure and the air between the speaker cones.

7. In a sound reproducer for faithfully reproducing sound from electric signals having frequencies higher than about 200 hertz, a mid-range loudspeaker having a cone suspended for vibration in a frame about 4½ inches in diameter and about 2 inches deep, the frame is mounted in the face panel of an essentially closed box not more than about 2 inches deep, the face panel extending at least about 7 inches out from the cone for at least 270° of the cone periphery, the frame mounting being about one to about 3 inches away from the center of that face panel, a tweeter is mounted in the face panel adjacent the mid-range loudspeaker, the box enclosing the back waves of the loudspeaker and of the tweeter and being essentially free of vibratory response to sound frequencies higher than about 200 hertz.

8. The combination of claim 7 in which the face panel is at least about ⅝ inch thick, and the box has a rear panel as well as a set of rigidifying spacers between the panels, the panels being rigidly secured together sandwiched about the spacers to help prevent the vibratory response.

9. The combination of claim 7 in which the suspension of the cone in its frame includes a resilient ring as the only connection between the frame and the outer edge of the cone, and spaced dabs of stiffening material about ⅛ to about ⅜ inch in size are applied to the ring to locally reduce its resilience and reduce the tendency for ringing at the operating frequencies of that cone.

10. The combination of claim 1 in which the box contains a support for an upright, a paddle-shaped upright has its handle portion positioned in said support, and a pair of sound reproducers are secured to the opposite faces of the paddle portion of the upright to face outwardly, each of said pair including a mid-range loudspeaker having a cone suspended for vibration in a frame about 4½ inches in diameter and about 2 inches deep, the frame is mounted in the face panel of an essentially closed box not more than about 2 inches deep, the face panel extending at least about 7 inches out from the cone for at least 270° of the cone periphery, the frame mounting being about one to about 3 inches away from the center of that face panel, a tweeter is mounted in the face panel adjacent the mid-range loudspeaker, the last-mentioned box enclosing the back waves of the last-mentioned loudspeaker and of the tweeter and being essentially free of vibratory response to sound frequencies higher than about 200 hertz.

11. The combination of claim 1 in which the outer duct is a shallow duct about as wide and about as high as the box.

* * * * *